US008558624B2

(12) United States Patent
Raita (10) Patent No.: US 8,558,624 B2
(45) Date of Patent: Oct. 15, 2013

(54) SEMICONDUCTOR INTEGRATED CIRCUIT (75) Inventor: Kazuhisa Raita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 310 days.

(21) Appl. No.: 12/986,557

(22) Filed: Jan. 7, 2011

(65) Prior Publication Data

US 2011/0102092 A1   May 5, 2011

Related U.S. Application Data (63) Continuation of application No. PCT/JP2009/002494, filed on Jun. 3, 2009.

(30) Foreign Application Priority Data

Jul. 9, 2008   (JP) ................................ P2008-179118

(51) Int. Cl.
    H03B 5/30     (2006.01)
    H03K 3/03     (2006.01)

(52) U.S. Cl.
    USPC .............. 331/47; 331/48; 331/55; 331/57; 331/108 C; 331/154; 331/173

(58) Field of Classification Search
    USPC .......... 331/36 R, 46–49, 55, 57, 108 C, 154, 331/158, 172–174
    See application file for complete search history.

(56) References Cited

U.S. PATENT DOCUMENTS

| 4,376,919 | A  | * | 3/1983  | Konno et al. ................ 331/158 |
| 5,126,695 | A  |   | 6/1992  | Abe |
| 6,157,265 | A  | * | 12/2000 | Hanjani ......................... 331/49 |
| 6,172,575 | B1 | * | 1/2001  | Shinmori ................. 331/116 FE |
| 6,819,195 | B1 | * | 11/2004 | Blanchard et al. ............. 331/173 |
| 6,903,616 | B2 | * | 6/2005  | Yin et al. ........................ 331/57 |
| 7,135,939 | B2 |   | 11/2006 | Koike et al. |
| 7,391,273 | B2 |   | 6/2008  | Seki et al. |
| 7,482,888 | B1 | * | 1/2009  | Kleveland ..................... 331/173 |
| 7,961,055 | B2 | * | 6/2011  | Miyata et al. ................... 331/18 |
| 2005/0046497 | A1 |   | 3/2005 | Nakanishi |

FOREIGN PATENT DOCUMENTS

| JP | 58-070630 A  | 4/1983  |
| JP | 61-059515 A  | 3/1986  |
| JP | 01-260518 A  | 10/1989 |
| JP | 3-159582     | 7/1991  |
| JP | 04-158419 A  | 6/1992  |
| JP | 05-259738 A  | 10/1993 |
| JP | 11-183660 A  | 7/1999  |
| JP | 2004-350203 A | 12/2004 |
| JP | 2005-064896 A | 3/2005  |

* cited by examiner

*Primary Examiner* — Levi Gannon (74) *Attorney, Agent, or Firm* — McDermott Will & Emery LLP (57) ABSTRACT

A semiconductor integrated circuit capable of reliably detecting oscillation stop of a vibrator-type oscillation circuit and reliably restarting the oscillation circuit when oscillation stop is detected is provided. The semiconductor integrated circuit includes one or more main oscillation circuits configured to generate a main clock signal by a vibrator, a ring oscillator configured to always operate independently of the main oscillation circuit, a main clock detection circuit configured to monitor the main clock signal on the basis of an output clock signal of the ring oscillator and to determine an operation state of the main oscillation circuit, and an switch circuit configured to switch a combination of elements making up the main oscillation circuit in response to a detection result of the main clock detection circuit.

13 Claims, 9 Drawing Sheets

SEMICONDUCTOR INTEGRATED CIRCUIT

This application is a continuation of International Application No. PCT/JP2009/002494, whose international filing date is Jun. 3, 2009, which in turn claims the benefit of Japanese Patent Application No. 2008-179118 filed on Jul. 9, 2008, the disclosures of which Applications are incorporated by reference herein. The benefit of the filing and priority dates of the International and Japanese Applications is respectfully requested.

BACKGROUND

This invention relates to a semiconductor integrated circuit for enhancing a fail-safe function for operation stop of a vibrator-type oscillation circuit.

There is a fail-safe function of realizing safe performance as a strong demand for an LSI, etc., intended for vehicle-installed application. To realize the fail-safe function of an LSI, malfunction of the LSI is monitored using a watchdog timer, etc., regardless of the normal operation time or the stop time. Since a measure of accuracy is required for a clock supplied to the LSI, a main clock is obtained from a high-accuracy vibrator-type oscillation circuit, but it is necessary to take measures against stop of the vibrator-type oscillation circuit because of fluctuation of power supply voltage, etc.

Figure 9:
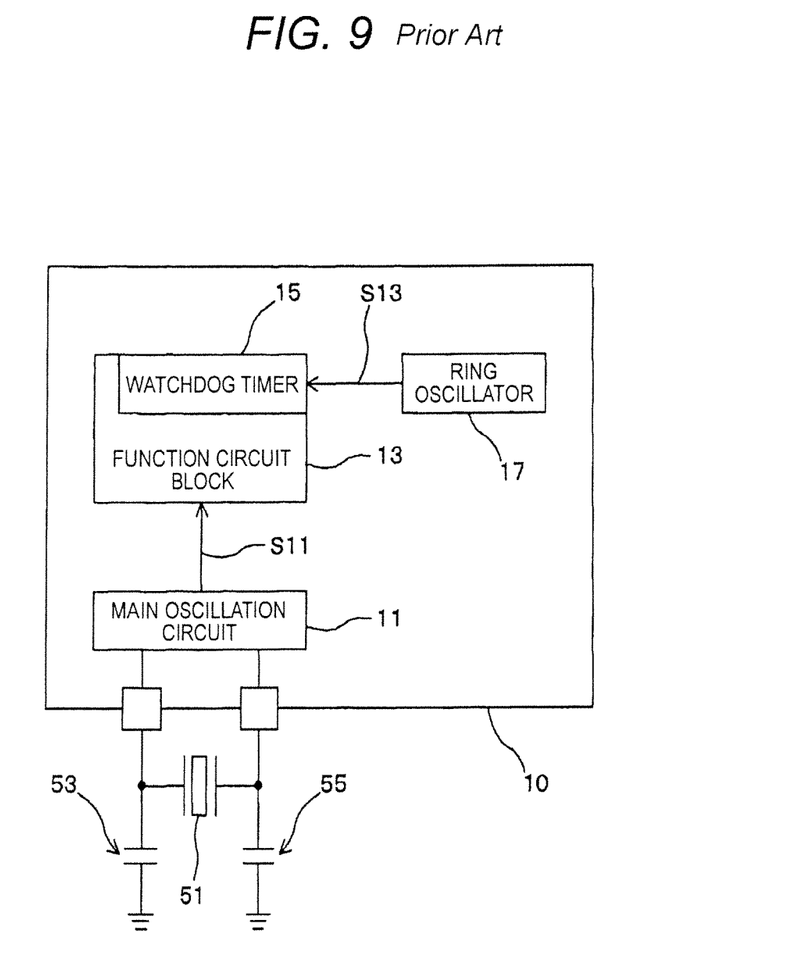
FIG. 9 is a block diagram to show a configuration example of a conventional LSI for monitoring malfunction using a watchdog timer.

As one of the measures, there is a technique of monitoring malfunction of LSI by a watchdog timer using an output clock of a ring oscillator always operating independently of the operation state of the vibrator-type oscillation circuit. FIG. 9 is a block diagram to show a configuration example of a conventional LSI for monitoring malfunction using a watchdog timer operating based on an output clock of a ring oscillator.

An LSI 10 shown in FIG. 9 includes a vibrator 51, a vibrator-type main oscillation circuit 11 for generating a main clock signal S11 based on an input-side oscillation capacity 53 and an output-side oscillation capacity 55, a function circuit block 13 containing a CPU, etc., for realizing the function intended by the LSI, a watchdog timer 15, and a ring oscillator 17 of low current consumption type always operating independently of the operation state of the main oscillation circuit 11.

The watchdog timer 15 uses an output clock signal S13 from the ring oscillator 17 and monitors the operation state of the function circuit block 13 operating according to the main clock signal S11. Thus, malfunction of the LSI 10 can be monitored independently of the operation state of the main oscillation circuit 11. The ring oscillator 17 used with the LSI 10 shown in FIG. 9 operates even at a low power supply voltage of about 1 V, is resistant to fluctuation of the power supply voltage, and consumes a small current.

Since a high-accuracy clock is required for a system LSI used with a digital clock, etc., a high-accuracy vibrator-type oscillation circuit supplies a main clock. In such a system LSI, it is necessary to guarantee that the oscillation circuit always normally operates and thus an oscillation stop detection circuit for directly monitoring output of a vibrator-type oscillation circuit is provided (for example, refer to Patent Literature 1). The oscillation stop detection circuit processes output of the oscillation circuit at a potential level, thereby detecting stop of the oscillation operation, controls power supply voltage of the oscillation circuit according to output of the oscillation circuit, and automatically restarts the oscillation circuit.

Patent Literature 1: JP-A-58-70630

As described above, the main clock supplied to the LSI is obtained from the high-accuracy vibrator-type oscillation circuit. However, when the vibrator-type oscillation circuit stops due to fluctuation of power supply voltage, etc., automatic operation recovery cannot be performed although an emergency step can be taken by monitoring malfunction of the LSI using the watchdog timer, etc. Thus, the function is insufficient as the fail-safe function. In the art shown in Patent Literature 1, output of the oscillation circuit is monitored at the potential level and when oscillation stops, the power supply voltage of the oscillation circuit is controlled and the oscillation circuit is restarted. Thus, intended operation is not guaranteed for fluctuation of the power supply voltage, etc.

SUMMARY

It is an object of the invention to provide a semiconductor integrated circuit capable of reliably detecting oscillation stop of a vibrator-type oscillation circuit and reliably restarting the oscillation circuit when oscillation stop is detected.

The invention provides a semiconductor integrated circuit including one or more main oscillation circuit configured to generate a main clock signal by a vibrator, a ring oscillator configured to always operate independently of the main oscillation circuit, a main clock detection circuit configured to monitor the main clock signal on the basis of an output clock signal of the ring oscillator and to determine an operation state of the main oscillation circuit, and a switch circuit configured to switch a combination of elements making up the main oscillation circuit in response to a detection result of the main clock detection circuit.

The semiconductor integrated circuit includes a high-speed RC oscillator configured to operate in response to a command from the switch circuit and to output a clock signal, and a clock selection circuit configured to select either of the main clock signal output from the main oscillation circuit and the clock signal output from the high-speed RC oscillator in response to a processing result of the switch circuit.

In the semiconductor integrated circuit, a frequency of the output clock signal of the ring oscillator is twice or more a frequency of the main clock signal.

The semiconductor integrated circuit includes a multiplication circuit configured to multiply a frequency of the output clock signal of the ring oscillator and to output a clock signal of a frequency twice or more a frequency of the main clock signal, wherein the main clock detection circuit monitors the main clock signal on the basis of the clock signal output from the multiplication circuit in place of the output clock signal of the ring oscillator and determines the operation state of the main oscillation circuit.

In the semiconductor integrated circuit, the multiplication circuit is PLL or DLL.

The semiconductor integrated circuit includes a frequency division circuit configured to divide a frequency of the input main clock signal so as to set the frequency to a half or less of the frequency of the output clock signal of the ring oscillator, wherein the main clock detection circuit monitors a division clock signal output from the frequency division circuit in place of the main clock signal on the basis of the output clock signal of the ring oscillator and determines the operation state of the main oscillation circuit.

In the semiconductor integrated circuit, the frequency division circuit is a flip-flop having one or more stages.

In the semiconductor integrated circuit, the combination of elements of the main oscillation circuit is previously decided by hardware.

In the semiconductor integrated circuit, the combination of elements of the main oscillation circuit is automatically switched by hardware.

In the semiconductor integrated circuit, the combination of elements of the main oscillation circuit is switched by software as desired.

In the semiconductor integrated circuit, when the clock selection circuit selects the output clock signal of the high-speed RC oscillator, a signal is output to an anomaly warning system provided outside the semiconductor integrated circuit.

According to the semiconductor integrated circuit according to the invention, if the vibration-type main oscillation circuit stops, the combination of the elements of the main oscillation circuit is switched, whereby the oscillation constant is changed and the main oscillation circuit can be restarted, so that the high-level fail-safe function can be realized.

Further, even if the combination of the elements of the main oscillation circuit is switched, when the main oscillation circuit does not restart, the output clock signal of the high-speed RC oscillator is used in place of the main clock signal, whereby the double fail-safe function can be realized.

DETAILED DESCRIPTION OF EXEMPLARY EMBODIMENTS

Embodiments of the invention will be discussed with reference to the accompanying drawings.

First Embodiment

Figure 1:
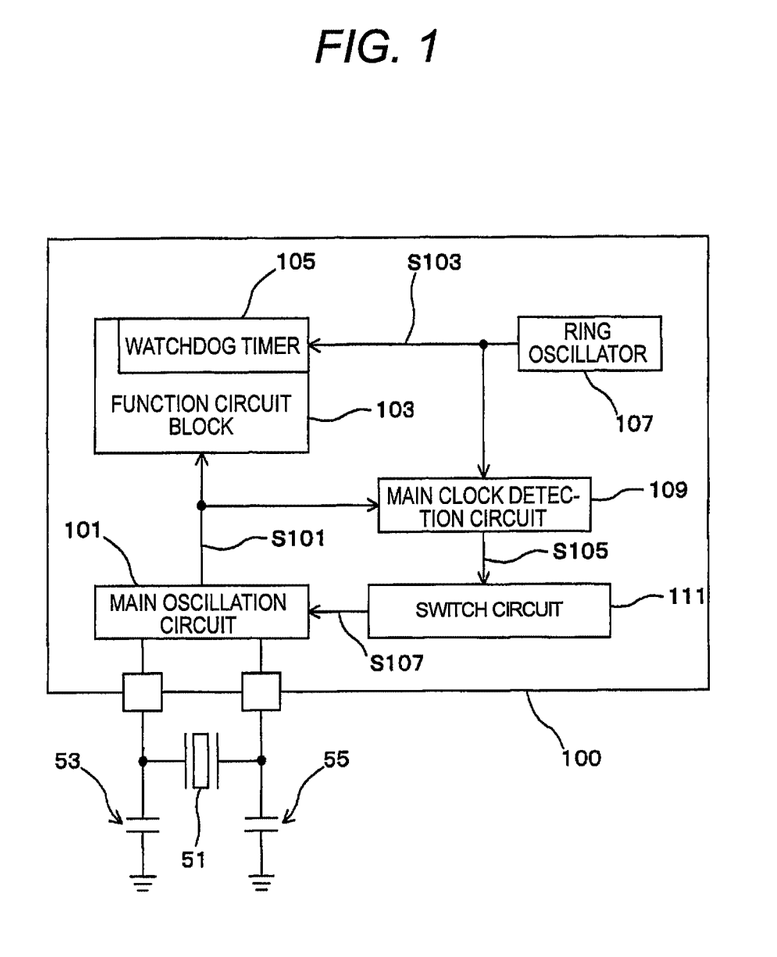
FIG. 1 is a block diagram to show an operation stop measure circuit of a first embodiment for a vibrator-type oscillation circuit.

FIG. 1 is a block diagram to show an operation stop measure circuit of a first embodiment for a vibrator-type oscillation circuit. An LSI shown in FIG. 1 includes a main oscillation circuit 101, a function circuit block 103, a watchdog timer 105, a ring oscillator 107, a main clock detection circuit 109, and an switch circuit 111.

The main oscillation circuit 101 generates a main clock signal S101 according to a vibrator 51, an input-side oscillation capacity 53, and an output-side oscillation capacity 55. The function circuit block 103 contains a CPU, etc., for realizing the function intended by the LSI. The ring oscillator 107 always operates independently of the operation state of the main oscillation circuit 101. That is, if the operation of the main oscillation circuit 101 stops, the ring oscillator 107 operates and generates an output clock signal S103.

The watchdog timer 105 uses the output clock signal S103 from the ring oscillator 107 and monitors the operation state of the function circuit block 103 operating according to the main clock signal S101. The function is the same as that of the LSI 10 shown in FIG. 9 and malfunction of the LSI can be monitored independently of the operation state of the main oscillation circuit.

The main clock detection circuit 109 receives the output clock signal S103 of the ring oscillator 107 used as a comparison clock and the main clock signal S101 output by the main oscillation circuit 101, monitors the main clock signal S101 with the output clock signal S103 as the reference, and determines the operation state of the main oscillation circuit 101. The switch circuit 111 switches a combination of the elements making up the main oscillation circuit 101 (internal circuit).

In the embodiment, if the main clock detection circuit 109 determines that the main oscillation circuit 101 is in a stop state, the main clock detection circuit 109 outputs an output signal S105 of a change command of the internal configuration of the main oscillation circuit 101 to the switch circuit 111.

Figure 2:
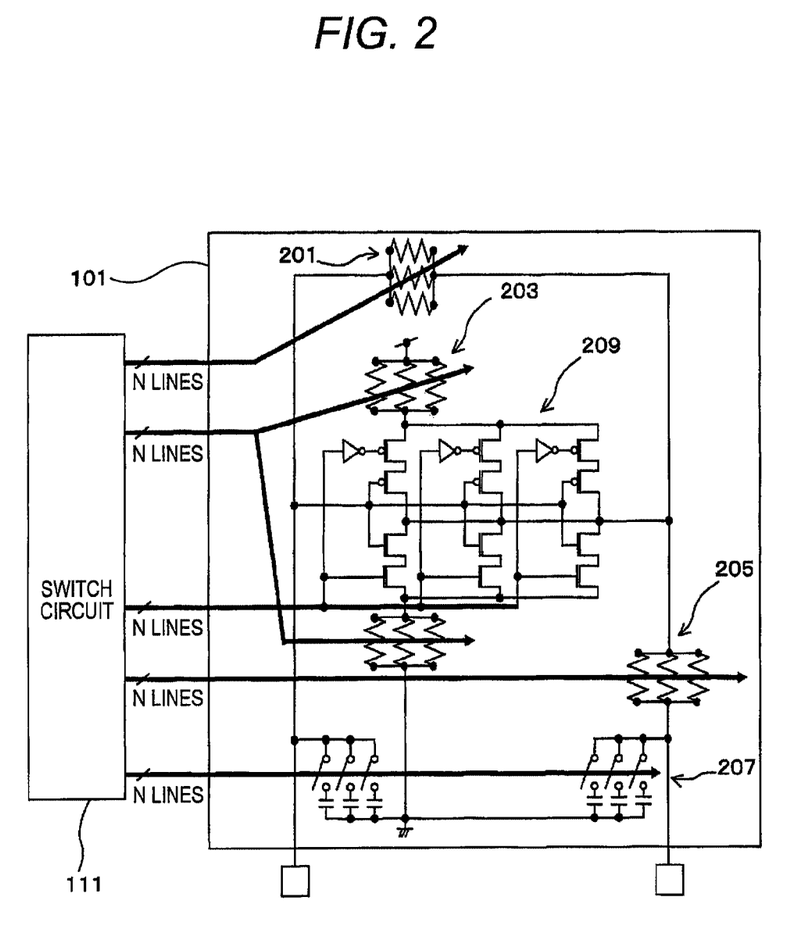
FIG. 2 is a circuit diagram to show a configuration example of elements in a main oscillation circuit.

FIG. 2 is a circuit diagram to show a configuration example of the elements in the main oscillation circuit 101. In FIG. 2, numeral 201 denotes an oscillation feedback resistor group, numeral 203 denotes an oscillation circuit through current limit resistor group, numeral 205 denotes a damping resistor group, numeral 207 denotes an internal oscillation capacity group, and numeral 209 denotes an oscillation amplification inverter group. In each circuit element group, the combination of the elements is switched in response to signal S107 of a plurality of lines (in FIG. 2, N lines) output from the switch circuit 111.

When receiving the output signal S105 from the main clock detection circuit 109, the switch circuit 111 selects a combination of resistors making up the oscillation feedback resistor group 201 of the main oscillation circuit 101 and outputs the output signal S107, thereby giving a command of switching the oscillation feedback resistor group 201 in the main oscillation circuit 101. Likewise, the switch circuit 111 gives switch commands of the oscillation circuit through current limit resistor group, the damping resistor group 205, the internal oscillation capacity group 207, and the oscillation amplification inverter group 209 in order. The internal configuration of each circuit element group is thus switched, an oscillation constant of the main oscillation circuit 101 changes. The oscillation constant of the main oscillation circuit 101 is changed, whereby the main oscillation circuit is restarted.

In the configuration example shown in FIG. 2, for example, the oscillation amplification inverter group 209 may be made up of a plurality of oscillation amplification inverters and each of other circuit element groups may be one element. That is, the combination of the elements of the main oscillation circuit 101 can be provided with flexibility. Even if the combination of the elements is previously determined by hardware, the combination of the elements may be switched automatically by hardware, or may be able to be switched by software as desired.

Figure 3:
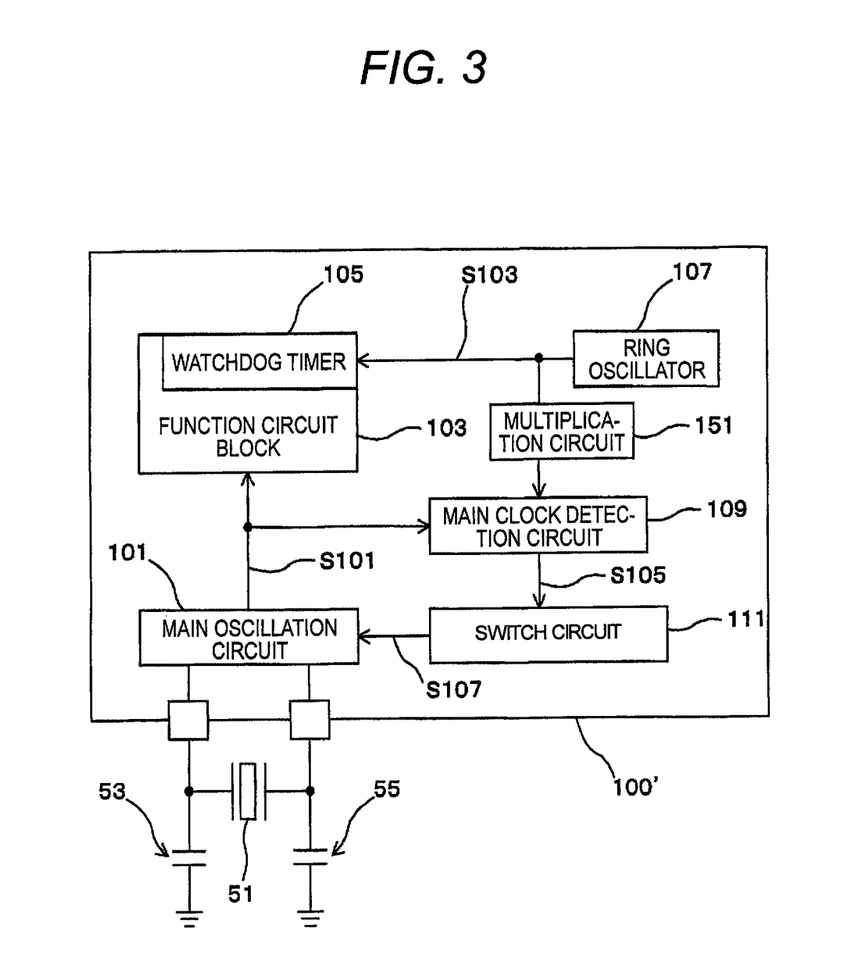
FIG. 3 is a block diagram to show a first modified example of the operation stop measure circuit of the first embodiment for setting the frequency of a comparison clock to twice or more the frequency of a detected clock.

In the embodiment, the frequency of the output clock signal S103 handled as the comparison clock in the main clock detection circuit 109 needs to be twice or more the frequency of the main clock signal S101 handled as a detected clock in the main clock detection circuit 109. Two possible methods as measures when the condition is not satisfied are as follows:

A first method is a method of inserting a circuit for raising the frequency of the output clock signal S103 of the comparison clock and inputting output of the circuit to the main clock detection circuit 109, thereby raising the frequency of the comparison clock to twice or more the frequency of the main clock signal S101. Specifically, as shown in FIG. 3, a multiplication circuit 151 of PLL, DLL, etc., is provided between the ring oscillator 107 and the main clock detection circuit 109 and the frequency of the comparison clock input to the main clock detection circuit 109 is raised to twice or more the frequency of the main clock signal S101.

Figure 4:
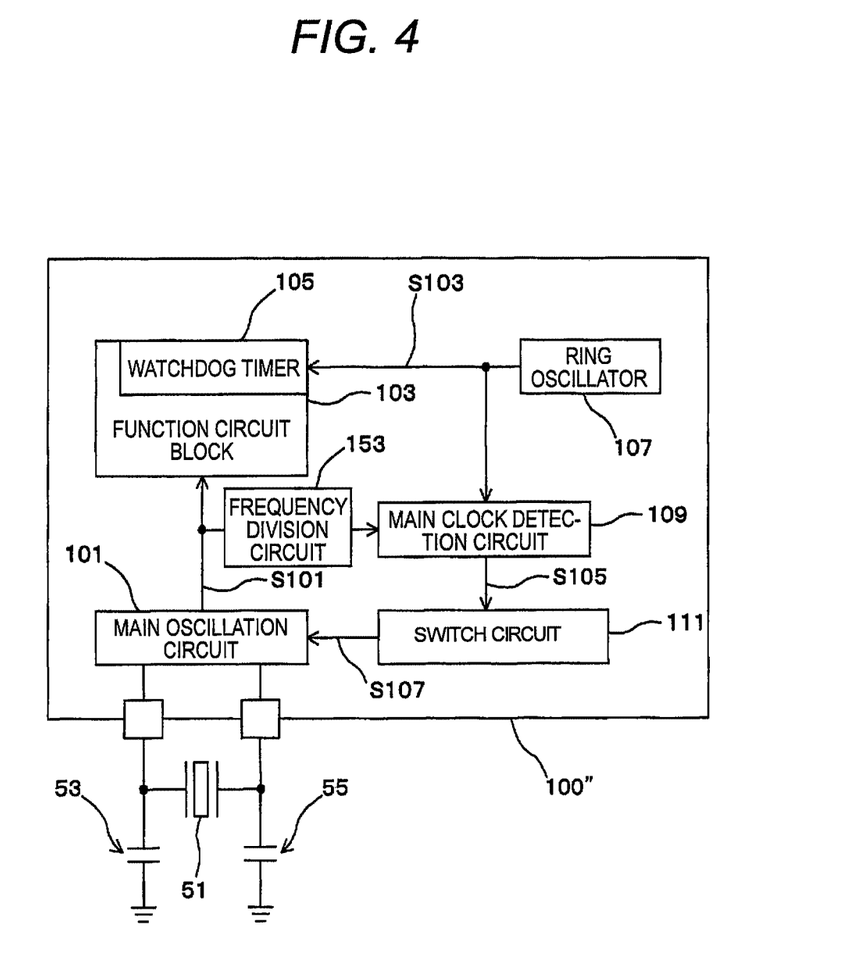
FIG. 4 is a block diagram to show a second modified example of the operation stop measure circuit of the first embodiment for setting the frequency of the comparison clock to twice or more the frequency of the detected clock.

A second method is a method of inserting a circuit for lowering the frequency of the main clock signal S101 of the detected clock and inputting output of the circuit to the main clock detection circuit 109, whereby the frequency of the output clock signal S103 becomes twice or more the frequency of the detected clock. Specifically, as shown in FIG. 4, a frequency division circuit 153 using a flip-flop, etc., is provided between the main oscillation circuit 101 and the main clock detection circuit 109 and output of the circuit is used as the detected clock input to the main clock detection circuit 109, whereby the frequency of the clock signal input to the main clock detection circuit 109 is raised to twice or more the frequency of the detected clock.

As described above, according to the embodiment, if the main oscillation circuit 101 stops because of fluctuation of power supply voltage, etc., the main clock detection circuit 109 detects it and the switch circuit 111 switches the oscillation constant of the main oscillation circuit 101, whereby the main oscillation circuit 101 can be restarted. Thus, the fail-safe function for operation stop of the main oscillation circuit 101 because of an anomaly can be realized. When the main oscillation circuit 101 does not normally operate because of a defect, etc., of a manufacturing process, the main oscillation circuit 101 can be operated normally.

Second Embodiment

Figure 5:
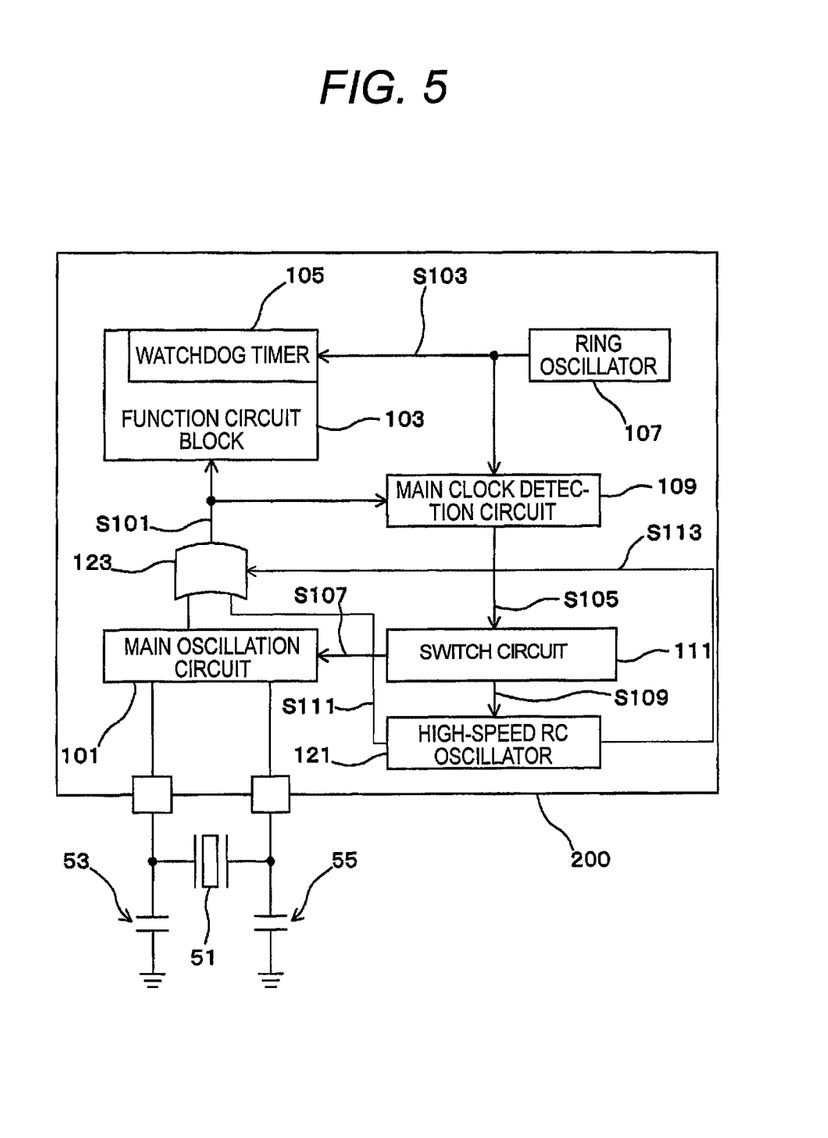
FIG. 5 is a block diagram to show an operation stop measure circuit of a second embodiment for a vibrator-type oscillation circuit.

FIG. 5 is a block diagram to show an operation stop measure circuit of a second embodiment for a vibrator-type oscillation circuit. An LSI 200 shown in FIG. 5 includes the main oscillation circuit 101, the function circuit block 103, the watchdog timer 105, the ring oscillator 107, the main clock detection circuit 109, and the switch circuit 111 included by the LSI 100 of the first embodiment shown in FIG. 1 and further includes a high-speed RC oscillator 121 and a selection circuit 123. Components common to those in FIG. 1 are denoted by the same reference numerals in FIG. 5 and will not be discussed again.

The high-speed RC oscillator 121 is used to realize a double fail-safe function when the main oscillation circuit 101 is not restarted although an attempt is made to restart the main oscillation circuit 101 by changing an oscillation constant of the main oscillation circuit 101 by the switch circuit 111. The selection circuit 123 selects either of a main clock signal S101 output by the main oscillation circuit 101 and an output clock signal S111 of the high-speed RC oscillator 121.

At the usual time, the selection circuit 123 selects the main clock signal S101 of the main oscillation circuit 101 and supplies the main clock signal S101 to the function circuit block 103 and the main clock detection circuit 109. When the main clock detection circuit 109 determines that the main oscillation circuit 101 is in a stop state, the switch circuit 111 switches the oscillation constant of the main oscillation circuit 101, thereby attempting to restart the main oscillation circuit 101 as in the first embodiment. Nevertheless, if the main oscillation circuit 101 does not restart, in the second embodiment, the switch circuit 111 outputs a selection signal S109 for operating the high-speed RC oscillator 121.

After a lapse of the wait time for oscillation of the high-speed RC oscillator 121 to become stable, the high-speed RC oscillator 121 sends a clock switch signal S113 to the selection circuit 123 and sets the selection circuit 123 so as to select the output clock signal S111 of the high-speed RC oscillator 121. Thus, the output clock signal S111 of the high-speed RC oscillator 121 is supplied to the function circuit block 103 and the main clock detection circuit 109.

It is desirable that the wait time for oscillation of the high-speed RC oscillator 121 to become stable should be several μseconds or less from the viewpoint of safety. In the embodiment, as the double fail-safe function, the output clock signal S111 of the high-speed RC oscillator 121 is supplied to the function circuit block 103 and the main clock detection circuit 109, but this is a temporary measure and securing of a stable operation property by giving a clock is a purpose. Thus, finally recovery of the main oscillation circuit 101 by a vibrator 51 is basic.

In the embodiment, the frequency of the output clock signal S103 handled as a comparison clock in the main clock detection circuit 109 also needs to be twice or more the frequency of the main clock signal S101 handled as a detected clock. The measure when the condition is not satisfied is as described in the first embodiment.

Figure 6:
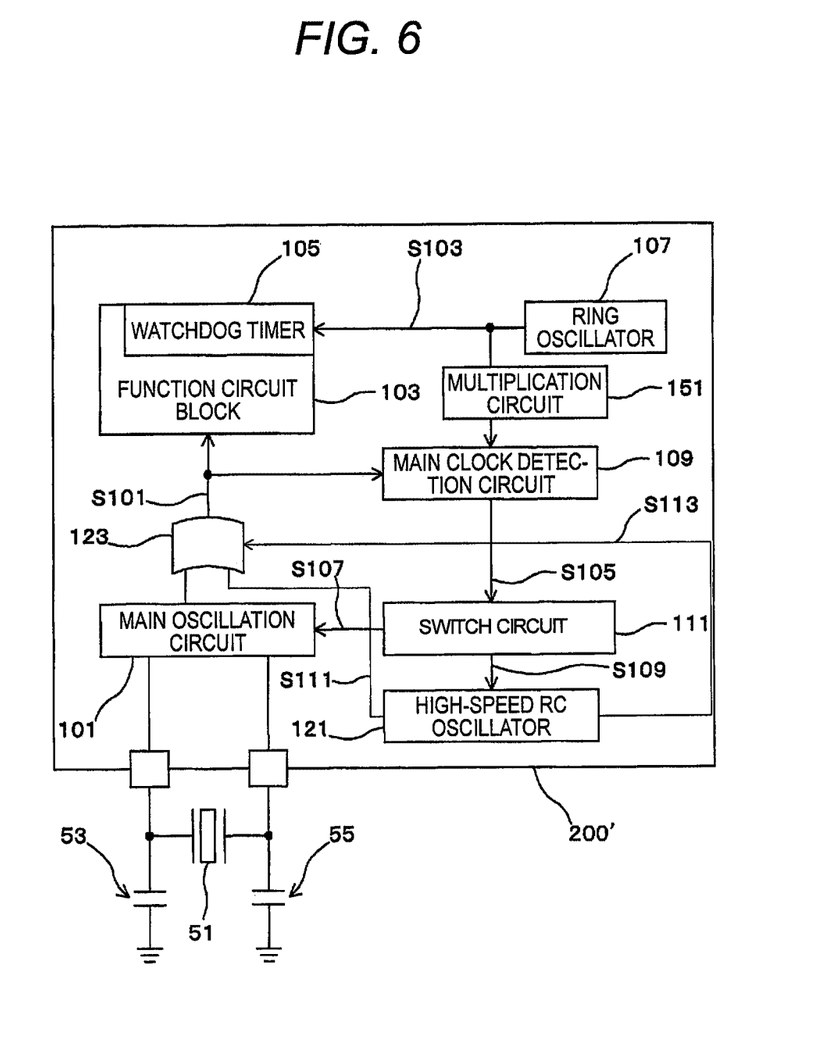
FIG. 6 is a block diagram to show a first modified example of the operation stop measure circuit of the second embodiment based on the first method described in the first embodiment.

FIG. 6 is a block diagram to show a first modified example of the operation stop measure circuit of the second embodiment based on the first method described in the first embodiment. As shown in FIG. 6, to set the frequency of the comparison clock to twice or more the frequency of the detected clock, a multiplication circuit 151 of PLL, DLL, etc., may be provided between the ring oscillator 107 and the main clock detection circuit 109.

Figure 7:
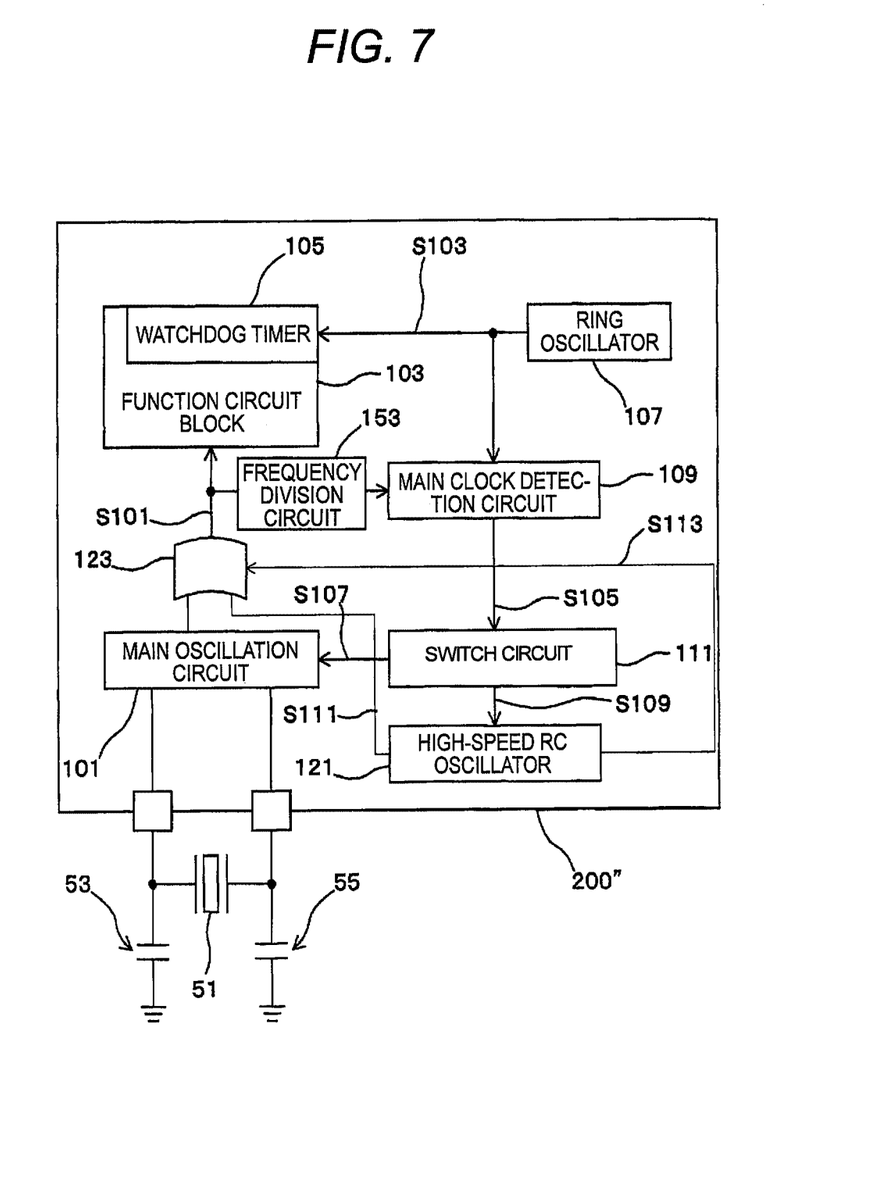
FIG. 7 is a block diagram to show a second modified example of the operation stop measure circuit of the second embodiment based on the second method described in the first embodiment.

FIG. 7 is a block diagram to show a second modified example of the operation stop measure circuit of the second embodiment based on the second method described in the first embodiment. As shown in FIG. 7, to set the frequency of the comparison clock to twice or more the frequency of the detected clock, a frequency division circuit 153 using a flip-flop, etc., may be provided between the main oscillation circuit 101 and the main clock detection circuit 109.

As described above, according to the embodiment, if the main oscillation circuit 101 stops because of fluctuation of power supply voltage, etc., the main clock detection circuit 109 detects it and the switch circuit 111 switches the oscillation constant of the main oscillation circuit 101, whereby the main oscillation circuit 101 can be restarted. Further, even if the switch circuit 111 attempts to restart the main oscillation circuit 101, if the operation of the main oscillation circuit 101 remains to stop, the output clock signal S111 of the high-speed RC oscillator 121 is used in place of the main clock signal S101, so that the double fail-safe function is realized. Thus, safety is further improved.

Third Embodiment

Figure 8:
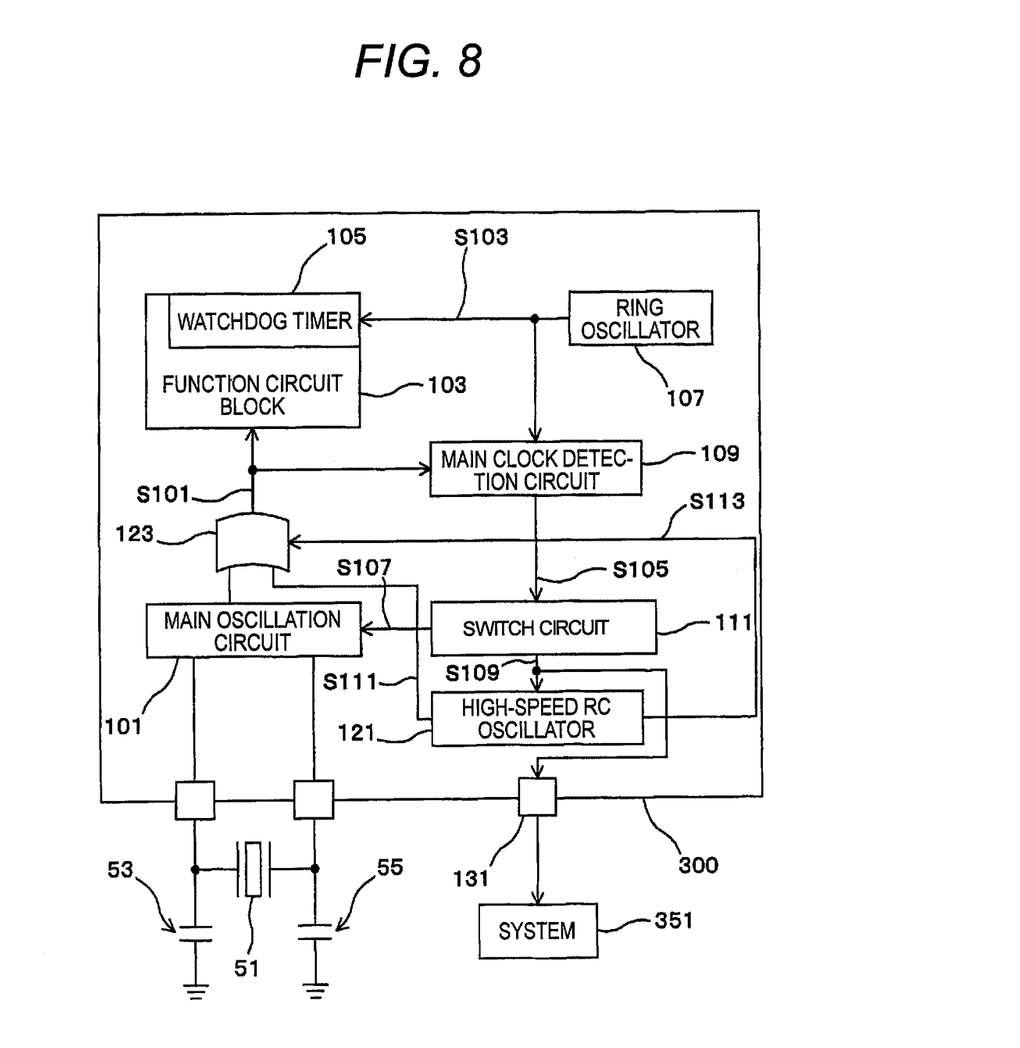
FIG. 8 is a block diagram to show an operation stop measure circuit of a third embodiment for a vibrator-type oscillation circuit.

FIG. 8 is a block diagram to show an operation stop measure circuit of a third embodiment for a vibrator-type oscillation circuit. An LSI 300 shown in FIG. 8 includes the main oscillation circuit 101, the function circuit block 103, the watchdog timer 105, the ring oscillator 107, the main clock detection circuit 109, the switch circuit 111, the high-speed RC oscillator 121, and the selection circuit 123 included by the LSI 200 of the second embodiment shown in FIG. 5 and further includes an output port 131 of a selection signal S109 output from the switch circuit 111. Components common to those in FIG. 5 are denoted by the same reference numerals in FIG. 8 and will not be discussed again.

The selection signal 109 of a signal output from the switch circuit 111 to the high-speed RC oscillator 121 is input not only to the high-speed RC oscillator 121, but also to the output port 131. From the output port 131, the selection signal 109 input from the switch circuit 111 is output to the outside of the LSI 300. The selection signal 109 output from the output port 131 is input to a system 351 for turning on a warning lamp, etc., for issuing a warning.

According to the embodiment, if the main oscillation circuit 101 stops because of fluctuation of power supply voltage, etc., the main clock detection circuit 109 detects it and the switch circuit 111 switches the oscillation constant of the main oscillation circuit 101, whereby the main oscillation circuit 101 can be restarted. Further, even if the switch circuit 111 attempts to restart the main oscillation circuit 101, if the operation of the main oscillation circuit 101 remains to stop, the output clock signal S111 of the high-speed RC oscillator 121 is used in place of the main clock signal S101, so that the double fail-safe function is realized and the user can be prompted to recover the main oscillation circuit 101 by the system for turning on an external warning lamp, etc., for issuing a warning.

While the invention has been described in detail with reference to the specific embodiments, it will be obvious to those skilled in the art that various changes and modifications can be made without departing from the spirit and the scope of the invention.

This application is based on Japanese Patent Application (No. 2008-179118) filed on Jul. 9, 2008, the contents of which are incorporated herein by reference.

The semiconductor integrated circuit according to the invention is useful as various system LSIs, etc., having the fail-safe function to which a clock signal is supplied from a vibrator-type oscillation circuit.

What is claimed is:

1. A semiconductor integrated circuit comprising:
   a main oscillation circuit configured to generate a main clock signal by a vibrator;
   a ring oscillator configured to always operate independently of the main oscillation circuit;
   a main clock detection circuit configured to monitor the main clock signal on the basis of an output clock signal of the ring oscillator and to determine whether or not the main oscillation circuit stops; and
   a switch circuit configured to switch a combination of elements constituting the main oscillation circuit in response to the main clock detection circuit determining that the main oscillation circuit stops.

2. The semiconductor integrated circuit according to 1, further comprising:
   a high-speed RC oscillator configured to operate in response to a command from the switch circuit and to output a clock signal; and
   a clock selection circuit configured to select either of the main clock signal output from the main oscillation circuit and the clock signal output from the high-speed RC oscillator in response to a processing result of the switch circuit.

3. The semiconductor integrated circuit according to claim 2, wherein when the clock selection circuit selects the output clock signal of the high-speed RC oscillator, a signal is output to an anomaly warning system provided outside the semiconductor integrated circuit.

4. The semiconductor integrated circuit according to claim 1, wherein a frequency of the output clock signal of the ring oscillator is twice or more a frequency of the main clock signal.

5. The semiconductor integrated circuit according to claim 1, further comprising:
   a multiplication circuit configured to multiply a frequency of the output clock signal of the ring oscillator and to output a clock signal of a frequency twice or more a frequency of the main clock signal,
   wherein the main clock detection circuit monitors the main clock signal on the basis of the clock signal output from the multiplication circuit in place of the output clock signal of the ring oscillator and determines whether or not the main oscillation circuit stops.

6. The semiconductor integrated circuit according to claim 5, wherein the multiplication circuit is PLL or DLL.

7. The semiconductor integrated circuit according to claim 1, further comprising:
   a frequency division circuit configured to divide a frequency of the input main clock signal so as to set the frequency to a half or less of the frequency of the output clock signal of the ring oscillator,
   wherein the main clock detection circuit monitors a division clock signal output from the frequency division circuit in place of the main clock signal on the basis of the output clock signal of the ring oscillator and determines whether or not the main oscillation circuit stops.

8. The semiconductor integrated circuit according to claim 7, wherein the frequency division circuit is a flip-flop having one or more stages.

9. The semiconductor integrated circuit according to claim 1, wherein the combination of elements of the main oscillation circuit is previously decided by hardware.

10. The semiconductor integrated circuit according to claim 1, wherein the combination of elements of the main oscillation circuit is automatically switched by hardware.

11. The semiconductor integrated circuit according to claim 1, wherein the combination of elements of the main oscillation circuit is switched by software as desired.

12. The semiconductor integrated circuit according to claim 1, further comprising:
   a watchdog timer configured to use the output clock signal from the ring oscillator and monitor an operation state of the main oscillation circuit.

13. The semiconductor integrated circuit according to claim 1, wherein the switch circuit switches an oscillation constant of the main oscillation circuit so that the main oscillation circuit is restarted if the main oscillation circuit stops.

* * * * *